(12) United States Patent
Chou et al.

(10) Patent No.: US 6,552,433 B1
(45) Date of Patent: Apr. 22, 2003

(54) BOND PADS USING MESH PATTERN VIA STRUCTURES FOR PROTECTING DEVICES/CIRCUITS UNDER I/O PADS

(75) Inventors: Kuo-Yu Chou, Hsin-chu (TW); Tong-Chern Ong, Chong-Her (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/858,529

(22) Filed: May 17, 2001

(51) Int. Cl.[7] .................. H01L 23/48; H01L 23/52; H01L 29/40
(52) U.S. Cl. .............. 257/758; 257/750; 257/760; 438/622; 438/624
(58) Field of Search ................ 257/758, 750, 257/760; 438/622, 624

(56) References Cited

U.S. PATENT DOCUMENTS

| | | | |
|---|---|---|---|
| 5,700,735 A | 12/1997 | Shiue et al. | 438/612 |
| 5,736,791 A | 4/1998 | Fujiki et al. | 257/781 |
| 5,739,587 A | 4/1998 | Sato | 257/758 |
| 5,891,799 A * | 4/1999 | Tsui | 438/624 |
| 5,923,088 A | 7/1999 | Shiue et al. | 257/758 |
| 6,028,367 A | 2/2000 | Yu | 257/780 |
| 6,143,396 A * | 11/2000 | Saran et al. | 257/773 |
| 6,180,511 B1 * | 1/2001 | Kim et al. | 438/626 |
| 6,251,781 B1 * | 6/2001 | Zhou et al. | 438/687 |

OTHER PUBLICATIONS

Liang et al. U.S. patent application Publication No. 2001/0045669, filed Apr. 10, 2001 and published Nov. 29, 2001.*

* cited by examiner

Primary Examiner—David Nelms
Assistant Examiner—Tu-Tu Ho
(74) Attorney, Agent, or Firm—George O. Saile; Stephen B. Ackerman

(57) ABSTRACT

A vertical structure and a method of forming a vertical structure are disclosed. A partially processed semiconductor wafer is provided having all devise levels completed, including a topmost interlevel dielectric layer through which metallic vias are formed for electrical connection. A first metal level is formed. An IMD level is then formed by forming a blanket dielectric layer over the first metal level, patterning and etching the dielectric layer to form arrays of trenches passing through the dielectric layer, filling the trenches with a conducting material, and performing CMP. A number of metal level, IMD level pairs are formed, where the number could be zero. Bonding metal patterns are deposited, wires are bonded onto the bonding metal patterns and a passivation layer is formed.

27 Claims, 6 Drawing Sheets

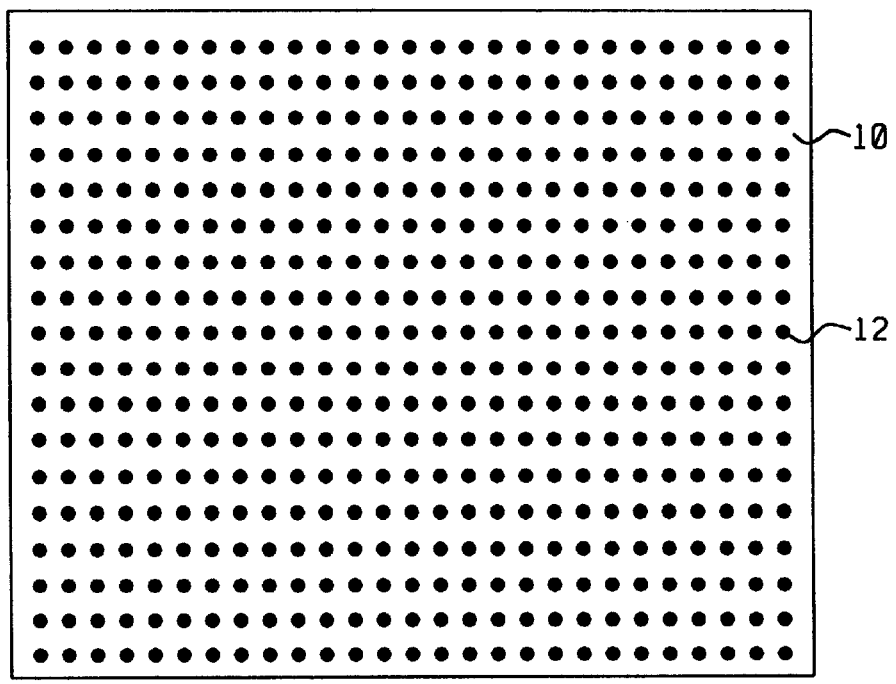
FIG. 1 — Prior Art
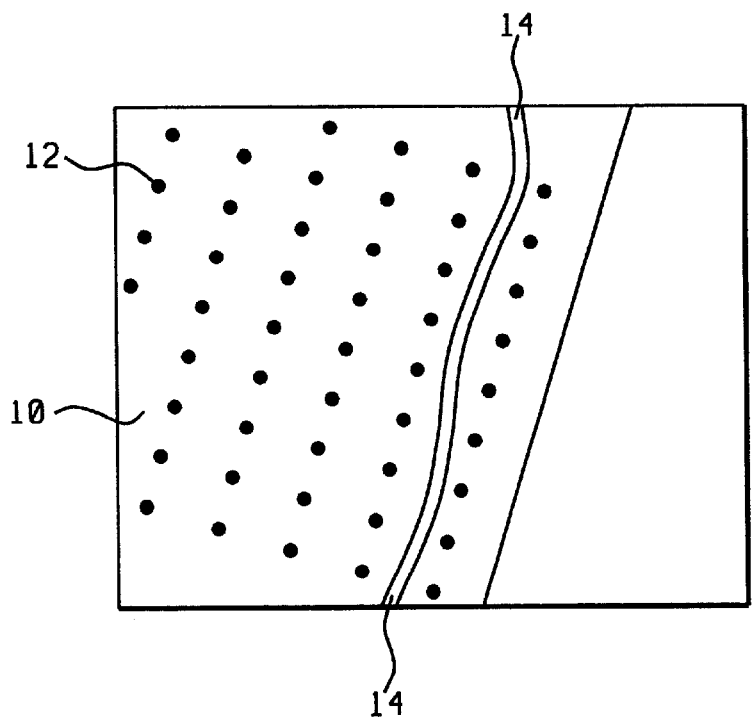
FIG. 2 — Prior Art

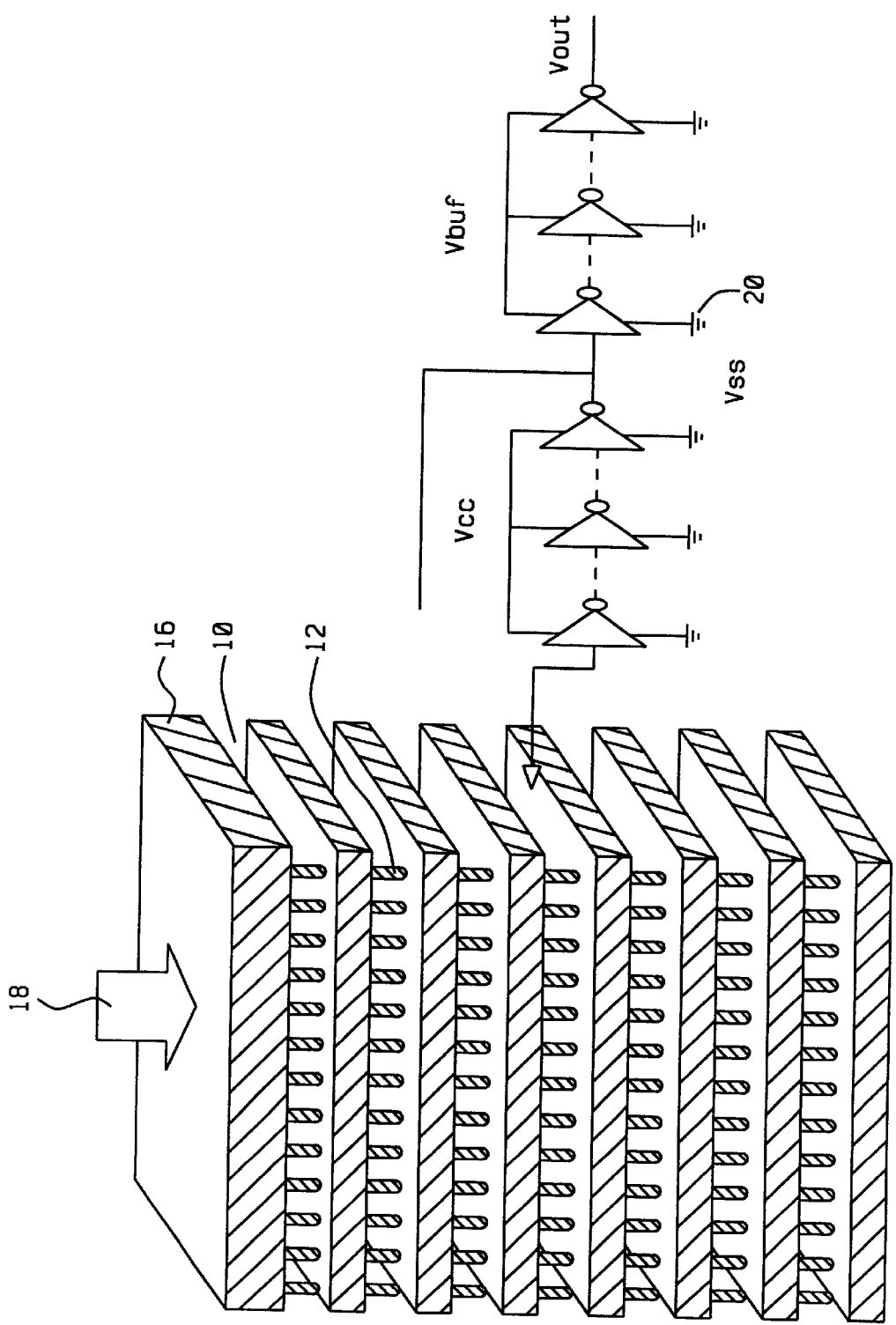
FIG. 3 – Prior Art

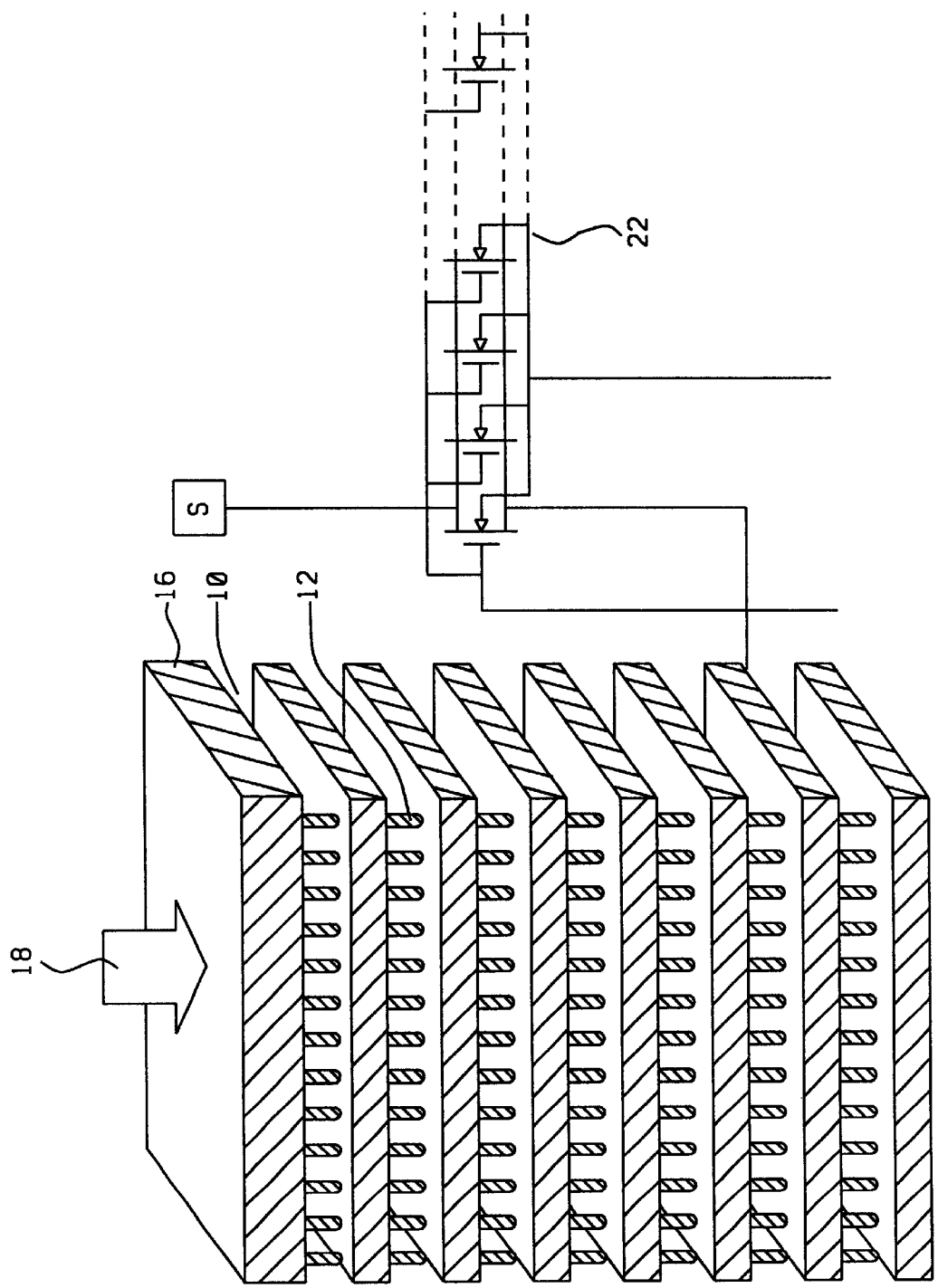
FIG. 4 – Prior Art

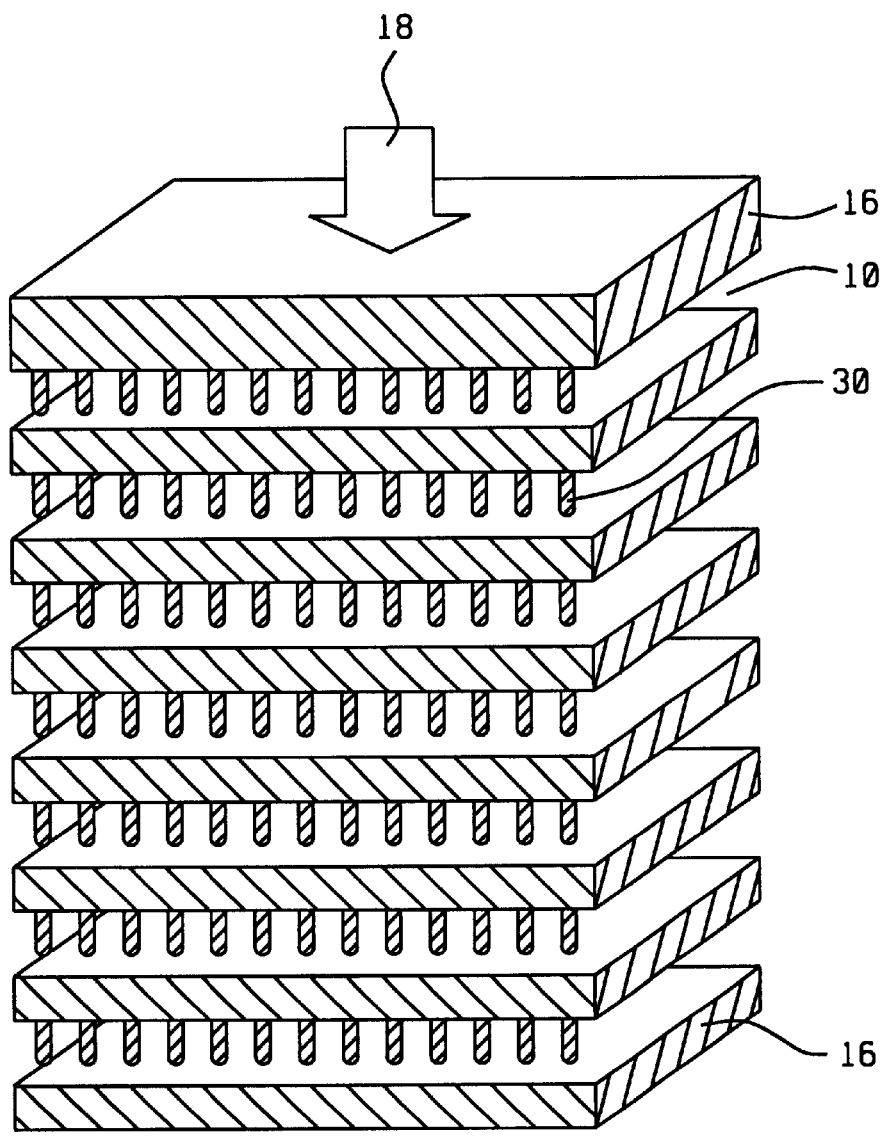
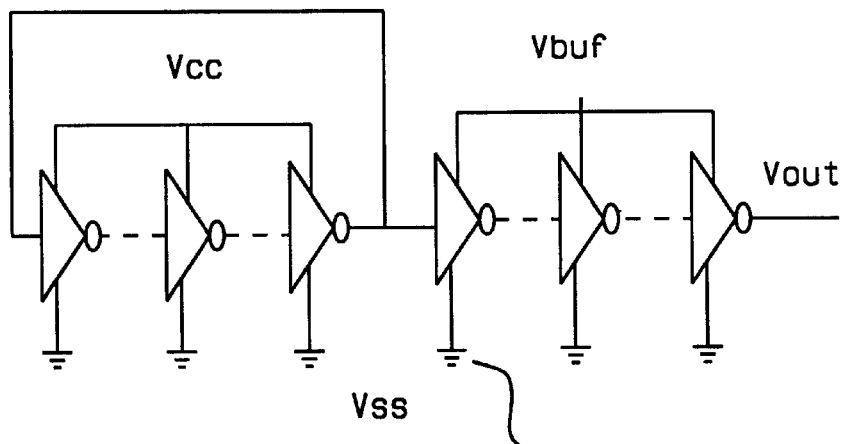
FIG. 6

BOND PADS USING MESH PATTERN VIA STRUCTURES FOR PROTECTING DEVICES/CIRCUITS UNDER I/O PADS

RELATED APPLICATION

This application is related to TSMC-00-523, Ser. No. 09/945,432 filing date Sep. 4, 2001, assigned to a common assignee.

BACKGROUND OF THE INVENTION

(1) Field of the Invention

The present invention relates generally to semiconductor integrated circuit processing and more particularly to contact pad structures that resist intermetal dielectric (IMD) cracking and also to structures that increase circuit density on integrated circuit chips.

(2) Description of Prior Art

Trends toward increased circuit density and complexity in modern integrated circuit design have resulted in the requirement for significant increases in the number of input/output and power/ground pins per chip and the number of bond pads in order to connect to the package. To conserve active device area it is necessary to reduce the bond pad pitch. However, smaller bond pads are more easily damaged by the large mechanical stresses inherent in the bonding operation. Moreover, flip-chip packaging techniques with an area array are utilized to achieve the required high density of interconnection, which moves input/output bond pads from the periphery to positions in the vicinity of active areas. Generally, design rules have not allowed bonding pads over active areas, where they would be susceptible to damage from the large mechanical stresses of bonding. It is therefor required to devise structures and layouts that would satisfy the high-density requirements of advanced integrated circuit design and that would resist the high mechanical stresses of bonding.

Fujiki et al. in U.S. Pat. No. 5,736,791, discloses bonding pad structures, utilizing via holes, which resist cracking. Sato, U.S. Pat. No. 5,739,587, discloses bonding pad structures containing via holes, or grooves, which prevent moisture from entering devise areas. Bond pad structures that contain via holes and provide for reliable interconnections are disclosed by Shiue et al in U.S. Pat. Nos. 5,700,735 and 5,923,088. Yu in U.S. Pat. No. 6,028,367 discloses bond pads equipped with heat dissipating rings and containing via holes.

Bonding pads are the interfaces between the integrated circuits contained in semiconductor chips and the chip package. A large number of bonding pads is required to transmit power/ground and input/output signals to the chip devices. It is thus important that the bonding pad yield be sufficiently high to ensure a high per chip yield.

The general bonding pad structure consists of metal layers, emanating from the terminals of the chip devices, separated by intermetal dielectric (IMD) layers that are often silicon oxide. An IMD layer separates the uppermost metal layer from a bonding metal pattern that is formed over this IMD layer. Metal vias pass through the IMD layers connecting the metal layers to the bonding metal pattern. Wires are bonded to the bonding metal pattern and to the chip package forming electrical connections between the chip and the package. A passivation layer covers the surface, except over the bonding sites, to seal the chip from contaminants and for scratch protection.

An important failure mode involves cracking of the IMD. Referring to FIG. 1, there is shown a conventional via hole array. Region 10 is an IMD layer and regions 12 are metal filled via holes passing through the IMD. Cracks that are observed in the IMD are similar to that, 14, depicted in FIG. 2. These are cracks that propagate along the IMD layer avoiding the metal of the vias. Once a small crack is initiated it will, under stresses prevalent during processing, grow extensively.

To avoid problems in devices that could arise from bonding mechanical stresses design rules do not allow devices to underlie bonding pads. Therefor the situation is as depict in FIGS. 3 and 4, where chip areas under bonding pads are not utilized. In FIG. 3 there is shown a conventional bonding pad structure containing a multiplicity of metal levels, 16, separated by IMD levels, 10, through which pass metal filled via holes, 12. The arrow, 18, represents bonding mechanical stresses because of which devices, represented by the schematic 20, are not situated in the area under the bonding pad. This structure where the bonding pad and device occupy adjacent areas is denoted a horizontal structure. Thus chip area is thus underutilized in a horizontal structure, and this is to avoid problems that could arise from bonding mechanical stresses. A similar conventional bonding pad structure is shown in FIG. 4, where the horizontal components in this case are the bonding pad structure and devices to guard against electrostatic discharge, or ESD structures, 22. There is an added problem with ESD structures concerning optimization of chip area utilization. Whereas integrated circuit devices can be scaled down aggressively, this is not the case for ESD structures, which cannot be shrunk without sacrificing the to some extent the ability of the ESD structures to protect core circuits during packaging and handling. Again the horizontal structure underutilizes the chip area and in this case aggressive down scaling cannot be accomplished without paying the price of reduced ESD protection.

SUMMARY OF THE INVENTION

It is a primary objective of the invention to provide a new bonding pad structures that are immune to IMD cracking, withstanding even the stresses encountered during chip packaging and that does not allow transmission of damaging stress beyond the bonding pad structure. It is also a primary objective of the invention to disclose a new vertical structure in which devices can occupy chip area underlying new bonding pad structures, greatly improving the utilization of chip area. Novel mesh pad structures are proposed that increase bonding pad strength, eliminate extensive cracking of the IMD, and do not transmit damaging stress, originating from the bonding process, to underlying chip areas. Instead of traditional via holes, extended parallel trenches, filled with metal are formed through the IMD, with trenches of successive levels crisscrossing. The metal trenches form a mesh pattern that together with the metal layers effectively enclose the dielectric of the IMD layer into small cells surrounded by metal. This increases the strength of the bonding pad so that IMD cracking is less likely to occur. Furthermore, even in the unlikely event of the initiation of an IMD crack, the crack will propagate no further than the metal trench. Additionally the extensive metal mesh pattern can readily distort, thus relieving stress. It has been determined that whereas high, damaging stresses, originating in bonding, are found to extend to the chip area under conventional bonding pads, for bonding pads according to the invention high, damaging stresses do not penetrate to the underlying chip area. Therefor the chip area under bonding pads fabricated according to the invention, not being subject to high mechanical stress, is available for devices and, in particular, for ESD structures.

A vertical structure and a method of forming a vertical structure are disclosed. A partially processed semiconductor wafer is provided having all devise levels completed, including a topmost interlevel dielectric layer through which metallic vias are formed for electrical connection. A first metal level is formed. An IMD level is then formed by forming a blanket dielectric layer over the first metal level, patterning and etching the dielectric layer to form arrays of trenches passing through the dielectric layer, filling the trenches with a conducting material, and performing CMP. A number of metal level, IMD level pairs are formed, where the number could be zero. Bonding metal patterns are deposited, wires are bonded onto the bonding metal patterns and a passivation layer is formed.

BRIEF DESCRIPTION OF THE DRAWINGS

In the accompanying drawing forming a material part of this description, there is shown:

FIG. 1 shows a conventional via patterns.

FIG. 2 depicts a crack in the IMD of a conventional bonding pad.

FIGS. 3 and 4 show conventional horizontal structures.

FIG. 6 shows a new vertical structure.

DESCRIPTION OF THE PREFERRED EMBODIMENTS

Figure 5:
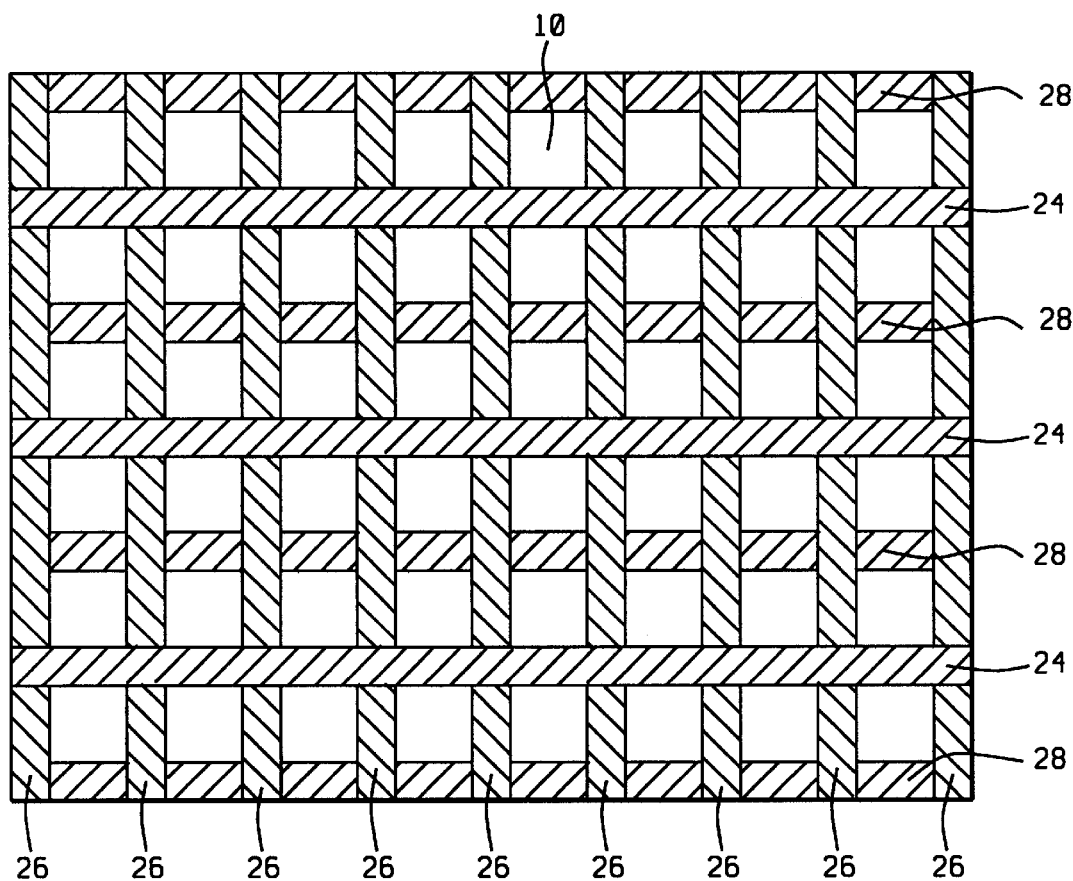
FIG. 5 shows a trench via mesh pattern according to the invention.

FIG. 5 illustrates the basic pattern of the novel via mesh pattern bonding pad structure. Metal filled trenches of three IMD levels are shown with the interposing metal levels deleted for the sake of clarity. Regions 24 are metal filled parallel trenches formed in an IMD layer between two metal layers. Regions 26 are similar trenches formed in the IMD just below that of regions 24 and trenches 26 are perpendicular to trenches 24. Regions 28 are also similar trenches, perpendicular to trenches 26, formed in the IMD just below that of the trenches 26. This pattern is continued for all IMD levels of the bonding pad. It should be clear that other particular patterns could serve as well. For example, the angle between trenches of successive layers need not be 90 degrees.

Figure 7:
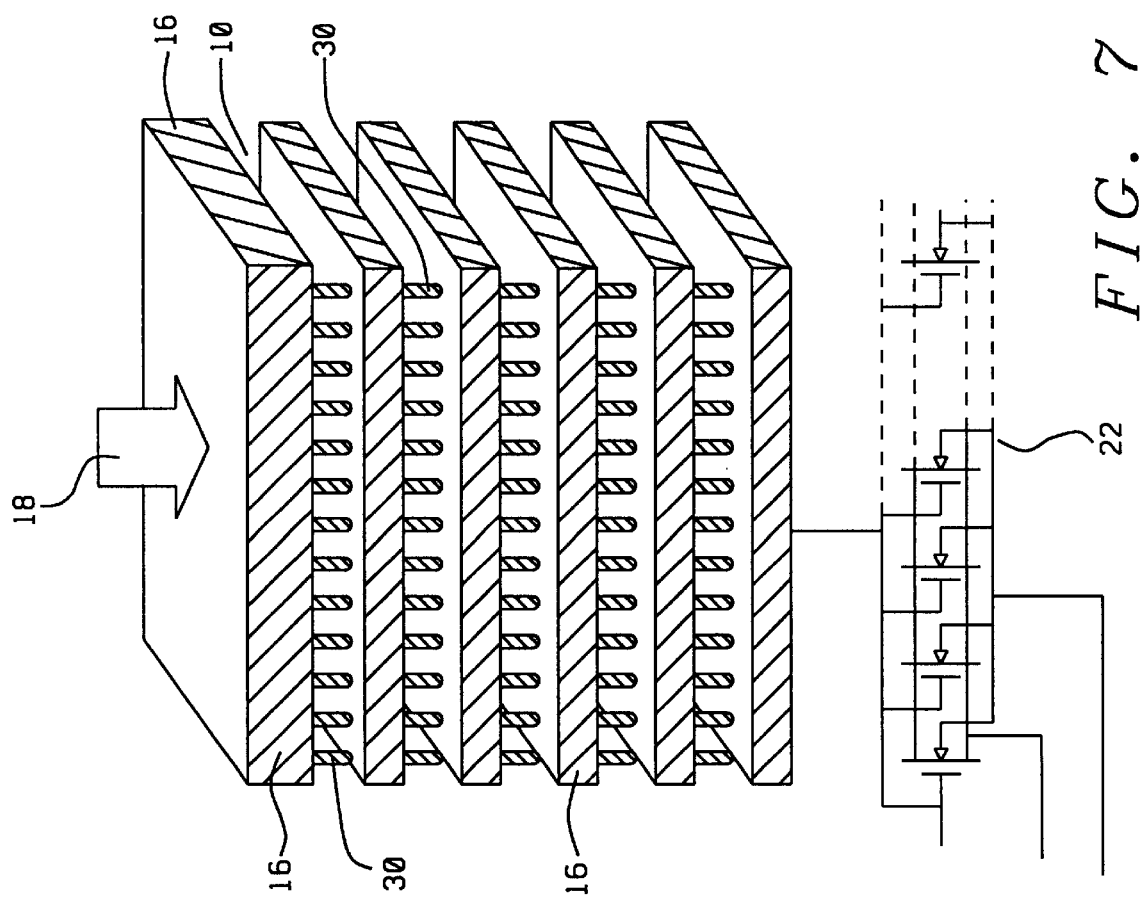
FIG. 7 shows a new vertical ESD structure.

What via trench mesh patterns according to the invention are used in bonding pads, no cracks are formed in the IMD by mechanical bonding stresses and no high damaging stress are transmitted to chip active areas situated under bonding pads. This result is found even for two-level metal stack bonding pads and up to eight-level metal stack bonding pads, for Cu metal interconnection systems of 0.13 micrometer CMOS technology. It is thus safe to locate devices in chip areas underlying bonding pads fabricated according to the invention if the bonding pad is constituted of at least a two level metal stack. Such a structure, devices under a bonding pad, is denoted a vertical structure. When the bonding pad of a vertical structure resists cracking even when subjected to mechanical bonding stresses and does not transmit high stress to the underlying chip area, the vertical structure is an embodiment of the invention. Placing devices under bending pads provides increased efficiency in utilization of chip area. Such a vertical structure, which is a favored embodiment of the invention, is shown in FIG. 6. There are at least two metal levels, 16, and the IMD levels contain parallel arrays of metal filled via trenches, 30. Integrated circuit devices, 20, are situated under the bonding pad. Electrical connection to the devices is accomplished by vias through an interlevel dielectric layer (IDL). Another favored embodiment of the invention is shown in FIG. 7, where ESD structures, 22 are situated under a similar bonding pad.

Basic elements of a bonding pad structure consist of metal layers, connected to the terminals of the chip devices, separated by IMD layers. Also there is an IMD layer separating the uppermost metal layer from a bonding metal pattern that is formed over this IMD layer and there are metal connectors passing through the IMD layers connecting the metal layers to the bonding metal pattern. Wires are bonded to the bonding metal pattern and to the chip package forming electrical connections between the chip and the package. A passivation layer covers the surface, except over the bonding sites, to seal the chip from contaminants and for scratch protection.

A via trench mesh pattern can be used between any two levels of metal. However, its crack resistance properties are mostly utilized when used between the uppermost metal layer and the bonding metal pattern. To form the via trench pattern, a blanket dielectric layer is first formed over a metal layer, using techniques well known to those skilled in the art. This dielectric layer is often silicon oxide, however other dielectric materials, such as silicon nitride or silicon oxynitride, can be used. Composite layers that relieve internal stress in the dielectric are useful, since this stress contributes to cracking in the dielectric layer, and preferred embodiments of the invention utilize such layers. Composite dielectric layers that are used to relieve internal stress include dual oxide layers, where, for instance, one of the layers is formed using HDP and the other using PETEOS.

However, composite dielectric layers do not protect the IMD layers from cracking as a result of stresses arising during chip packaging. This protection is achieved by the novel mesh pad structures of the embodiments of the invention. In contrast to the traditional bonding pad, in which via holes through the IMD layer are used to provide electrical connection between metal layers, in a mesh pad structure electrical connection is achieved by via trenches. Via trenches are formed using the same well known processes as via holes, except that the shapes of the openings are rectangular-like and extended. For trench widths of between about 0.1 and 0.5 micrometers, for trench lengths between about 0.1 and 100 micrometers, trench separations between 0.1 and 10 micrometers, and for IMD thickness between 0.5 and 2 micrometers the IMD strength is sufficiently increased so that cracking does not occur.

Filling of the via trenches with conductive material is accomplished, in preferred embodiments of the invention, using W plug processes, which are well known to those versed in the art. Other embodiments of the invention utilize alternative plug processes, such as Al plug, Cu plug, or silicide plug processes. Following the metal filling of the trenches, chemical/mechanical polishing (CMP), a process well known to practitioners of the art, is used to planarize the surface. Metal layers or, in the case of the top layer, bonding metal patterns are then deposited, according to procedures well known to those versed in the art. Wires are bonded to bonding metal patterns and a passivation layer is formed, using processes, for both, that well known to those versed in the art.

While the invention has been particularly shown and described with reference to the preferred embodiments thereof, it will be understood by those skilled in the art that various changes in form and detail may be made without departing from the spirit and scope of the invention.

What is claimed is:

1. A vertical structure and a method of forming a vertical structure, comprising:

providing a partially processed semiconductor wafer having all devise levels completed, including a topmost interlevel dielectric layer through which metallic vias are formed for electrical connection;

forming a first metal level with at least one devise disposed, at least partially, under said first metal level;

forming an IMD level by forming a blanket dielectric layer over said first metal level, patterning and etching said dielectric layer to form mesh patterns of trenches passing through said dielectric layer, filling said trenches with a conducting material, and performing CMP, which results in a structure which prevents cracking of the IMD;

forming n metal level, IMD level pairs, where n is an integer greater than or equal to zero;

depositing bonding metal patterns;

bonding wires onto said bonding metal patterns;

forming a passivation layer.

2. The method of claim 1 wherein said dielectric layer is composed of materials from the set: silicon oxide, silicon nitride, silicon oxynitride.

3. The method of claim 1 wherein said dielectric layer is a composite of dielectric layers.

4. The method of claim 1 wherein said dielectric layer is a composed of two layers, an oxide layer formed using HDP and an oxide layer formed using PETEOS.

5. The method of claim 1 wherein the filling of said trenches with a conducting material is accomplished using a plug process.

6. The method of claim 1 wherein the filling of said trenches with a conducting material is accomplished using a W plug process.

7. The method of claim 1 wherein the filling of said trenches with a conducting material is accomplished using a plug process from the set: AL plug, Cu plug, silicide plug.

8. The method of claim 1 wherein the width of said trenches is between 0.1 and 0.5 micrometers.

9. The method of claim 1 wherein the separation between neighboring trenches is between 0.1 and 10 micrometers.

10. A vertical structure and a method of forming a vertical structure, comprising:

providing a partially processed semiconductor wafer having completed ESD structures, including a topmost interlevel dielectric layer through which metallic vias are formed for electrical connection;

forming a first metal level with at least one ESD structure disposed, at least partially, under said first metal level;

forming an IMD level by forming a blanket dielectric layer over said first metal level, patterning and etching said dielectric layer to form mesh patterns of trenches passing through said dielectric layer, filling said trenches with a conducting material, and performing CMP, which results in a structure that prevents cracking of the IMD;

forming n metal level, IMD level pairs, where n is an integer greater than or equal to zero;

depositing bonding metal patterns;

bonding wires onto said bonding metal patterns;

forming a passivation layer.

11. The method of claim 10 wherein said dielectric layer is composed of materials from the set: silicon oxide, silicon nitride, silicon oxynitride.

12. The method of claim 10 wherein said dielectric layer is a composite of dielectric layers.

13. The method of claim 10 wherein said dielectric layer is a composed of two layers, an oxide layer formed using HDP and an oxide layer formed using PETEOS.

14. The method of claim 10 wherein the filling of said trenches with a conducting material is accomplished using a plug process.

15. The method of claim 10 wherein the filling of said trenches with a conducting material is accomplished using a W plug process.

16. The method of claim 10 wherein the filling of said trenches with a conducting material is accomplished using a plug process from the set: AL plug, Cu plug, silicide plug.

17. The method of claim 10 wherein the width of said trenches is between 0.1 and 0.5 micrometers.

18. The method of claim 10 wherein the separation between neighboring trenches is between 0.1 and 10 micrometers.

19. A bonding pad structure and a method of forming a bonding pad that is immune to IMD cracking and protects underlying areas from damaging stresses, comprising:

forming a first metal level over a topmost IDL;

forming an IMD level by forming a blanket dielectric layer over said first metal level, patterning and etching said dielectric layer to form mesh patterns of trenches passing through said dielectric layer, filling said trenches with a conducting material, and performing CMP, which results in a structure that prevents cracking of the IMD;

forming n metal level-IMD level pairs, where n is an integer greater than or equal to zero;

depositing bonding metal patterns;

bonding wires onto said bonding metal patterns;

forming a passivation layer.

20. The method of claim 19 wherein said dielectric layer is composed of materials from the set: silicon oxide, silicon nitride, silicon oxynitride.

21. The method of claim 19 wherein said dielectric layer is a composite of dielectric layers.

22. The method of claim 19 wherein said dielectric layer is a composed of two layers, an oxide layer formed using HDP and an oxide layer formed using PETEOS.

23. The method of claim 19 wherein the filling of said trenches with a conducting material is accomplished using a plug process.

24. The method of claim 19 wherein the filling of said trenches with a conducting material is accomplished using a W plug process.

25. The method of claim 19 wherein the filling of said trenches with a conducting material is accomplished using a plug process from the set: AL plug, Cu plug, silicide plug.

26. The method of claim 19 wherein the width of said trenches is between 0.1 and 0.5 micrometers.

27. The method of claim 19 wherein the separation between neighboring trenches is between 0.1 and 10 micrometers.

* * * * *